United States Patent
Oouchi et al.

(10) Patent No.: US 7,294,951 B2
(45) Date of Patent: Nov. 13, 2007

(54) PIEZOELECTRIC VIBRATOR, MANUFACTURING METHOD THEREOF, OSCILLATOR, ELECTRONIC EQUIPMENT, RADIO CLOCK

(75) Inventors: Keiichi Oouchi, Chiba (JP); Susumu Yoshida, Chiba (JP); Shuji Yamane, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 11/258,816

(22) Filed: Oct. 26, 2005

(65) Prior Publication Data

US 2006/0091765 A1 May 4, 2006

(30) Foreign Application Priority Data

Oct. 28, 2004 (JP) ............................. 2004-314323
Aug. 24, 2005 (JP) ............................. 2005-242320

(51) Int. Cl.
*H01L 41/053* (2006.01)
(52) U.S. Cl. ...................... 310/348; 310/370; 29/25.35
(58) Field of Classification Search ................ 310/348, 310/370; 29/25.35
See application file for complete search history.

(56) References Cited

U.S. PATENT DOCUMENTS

| 6,407,485 B1 * | 6/2002 | Aratake ..................... 310/344 |
| 6,504,290 B2 * | 1/2003 | Aratake et al. ............. 310/348 |
| 6,606,772 B1 * | 8/2003 | Nohara et al. ............. 29/25.35 |
| 6,924,582 B2 * | 8/2005 | Shimizu et al. ............. 310/312 |
| 2002/0047501 A1 * | 4/2002 | Tsuda et al. ................ 310/348 |
| 2004/0105347 A1 * | 6/2004 | Fujimori et al. ............ 368/293 |

OTHER PUBLICATIONS

Patent Abstracts of Japan, publication No. 2000-223995, publication date Aug. 11, 2000.

* cited by examiner

*Primary Examiner*—Darren Schuberg
*Assistant Examiner*—Derek Rosenau
(74) *Attorney, Agent, or Firm*—Adams & Wilks

(57) ABSTRACT

A piezoelectric vibrator has a vibrator piece and a frame integral with the vibrator piece. The frame is connected to one end of and surrounds the vibrator piece. A lid has a surface anodically bonded to a first surface of the frame. The lid has a recessed portion at a position disposed opposite to and confronting the vibrator piece. A base has a surface anodically bonded to a second surface of the frame opposite the first surface thereof. The base has a recessed portion at a position disposed opposite to and confronting the vibrator piece. A beveled portion is formed around a surface of one of the lid and the base which does not correspond to the anodically bonded surface thereof.

2 Claims, 8 Drawing Sheets

BB' CROSS SECTION

AA' CROSS SECTION

PRIOR ART FIG. 6
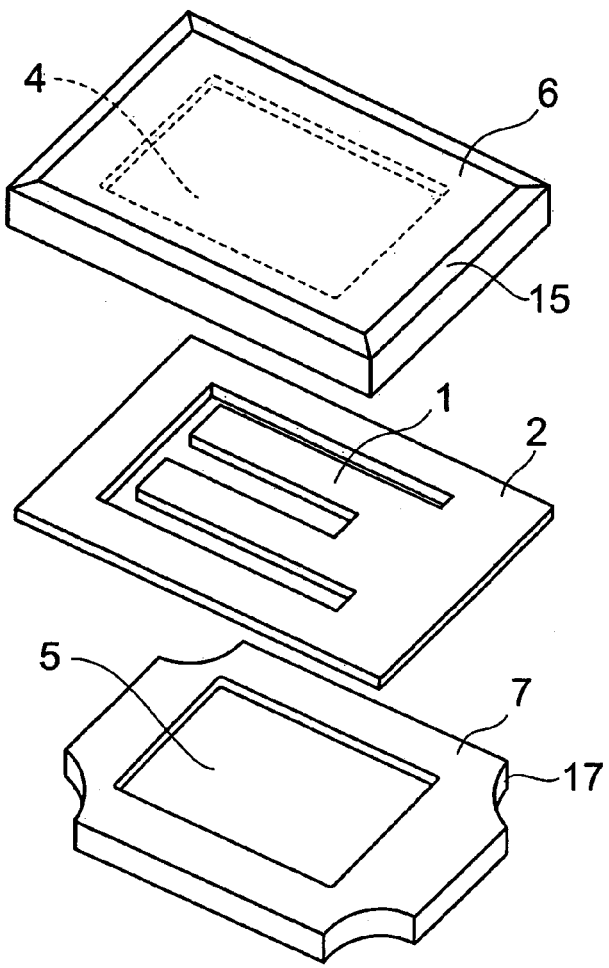
FIG. 7
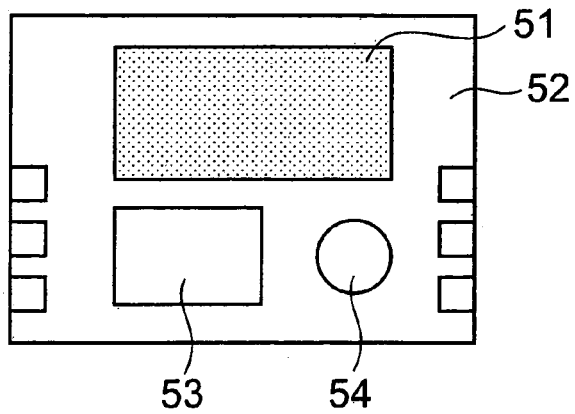

US 7,294,951 B2

PIEZOELECTRIC VIBRATOR, MANUFACTURING METHOD THEREOF, OSCILLATOR, ELECTRONIC EQUIPMENT, RADIO CLOCK

BACKGROUND OF THE INVENTION

1. Field of the Invention

The present invention relates to a piezoelectric vibrator, a manufacturing method thereof, and an oscillator, an electronic equipment or a radio clock which includes the piezoelectric vibrator.

2. Description of the Related Art

In mobile phones and personal information terminal equipments, a large number of piezoelectric vibrators are used as timing sources of control signals, reference signal sources, clock sources and the like. A large number of structures of the piezoelectric vibrators adopt a mode in which a vibrator piece is fixedly secured in the inside of a base formed of a box-like ceramic package using a conductive adhesive agent or a mode in which a vibrator piece is fixedly secured in the inside of a hermetic vessel of a cylinder type by solder plating. Along with the further miniaturization of the vibrator, it becomes difficult to accurately mount a vibrator piece on a holder such as a base or a plug made of ceramic. As an example of means which has possibility of solving this drawback, there has been known a piezoelectric vibrator which includes a frame (see Japanese Patent Laid-open 2000-223995, for example).

A specific example of surface-mount-type piezoelectric vibrator which has a frame provided with bonding films on front and back surfaces and bonds the frame, a lid and a base to each other is explained hereinafter in conjunction with drawings.

FIG. 6 is an exploded perspective view showing constitutional members of the surface-mount-type piezoelectric vibrator. In FIG. 6, the piezoelectric vibrator includes a frame 2 which is connected with one end of a vibrator piece 1 and is integrally formed in a state that the frame 2 surrounds the vibrator piece. Bonding films not shown in the drawing are formed on front and back surfaces of the frame 2. To the front surface side of the frame 2, a lid 6 having a first recessed portion 4 in a portion which faces the vibrator piece 1 is bonded by way of the bonding film. On four ridge portions of non-bonding surface side of the lid 6, beveling portions 15 are formed. To the back surface side of the frame 2 on a side opposite to the lid 6, a base 7 having a second recessed portion 5 on a portion which faces the vibrator piece 1 is bonded by way of the bonding film. The base 7 includes external terminal connecting portions 17 where external electrode films not shown in the drawing are formed at four corners thereof. Further, beveling portions similar to the beveling portions of the lid 6 are formed on four ridge portions on a non-bonding surface side of the base 7.

A manufacturing method of the piezoelectric vibrator having the above-mentioned constitution is explained simply using a flow of manufacturing steps shown in FIG. 10. A piezoelectric wafer which constitutes a first wafer is formed by cutting crystal in the rough, polishing the cut crystal to a given thickness and cleaning the polished crystal (step 50). Thereafter, a plurality of vibrator pieces which include exciting electrode films are formed on the wafer by chemical treatment such as etching. On front and back surfaces of a frame which is integrally connected to one ends of the vibrator pieces and surrounds peripheries of the vibrator pieces, bonding films are formed using a metal film made of aluminum, for example (step 51).

A second wafer (hereinafter referred to as "lid wafer") is polished to a given thickness and, thereafter, is cleaned, and an uppermost surface layer which is degenerated by machining is removed by etching or the like (step 60). Next, a first recessed portion is formed in a state that the mechanical deformation attributed to the vibration of the vibrator piece is not obstructed (step 61).

A third wafer (hereinafter referred to as "base wafer") is, in the same manner as the lid wafer, polished to a given thickness and, thereafter, is cleaned, and is etched (step 70). Subsequently, a second recessed portion is formed in a state that the mechanical deformation attributed to the vibration of the vibrator piece is not obstructed (step 71). Further, through holes (penetrated holes) for forming external electrodes are formed in the base wafer (step 72).

Three wafers which are prepared in the above-mentioned manner are aligned to given positions in accordance with reference marks which are formed on the respective wafers (step 80). A state in which three wafers are aligned with each other is shown in FIG. 11. As shown in FIG. 11, the first piezoelectric wafer 8 is configured to be sandwiched between the lid wafer 9 and the base wafer 10. Here, numeral 16 depicted by a broken line indicates through holes which are formed in step 72. Three wafers overlapped to each other are bonded using an anode bonding device (step 81). Subsequently, after bonding, grooves of a given size having a V-shaped cross section are formed in a surface side (non-contact surface side) of the base wafer using a dicing saw or the like (step 82). Here, the V-shaped groove forming is referred to as the bevel cutting.

Next, on the base wafer side, a metal thin film is formed on external terminal portions (step 83). Thereafter, the wafer is again set on the dicing saw or the like and is cut into individual piezoelectric vibrators (step 84). Here, the step in which a plurality of piezoelectric vibrators which are formed on the wafer are individually cut and separated is referred to as the full cutting. The individually separated piezoelectric vibrators are individually subjected to the frequency trimming, wherein the piezoelectric vibrators are trimmed to a given frequency (step 85). Finally, a corrosion resist film is applied to an outer surface of a housing of the piezoelectric vibrator by coating except for a terminal surface thus completing the piezoelectric vibrator (step 86). Here, although the portion where the through hole is formed in the wafer stage is divided in four by full cutting, the divided portion is referred to as an external terminal connecting portion. This portion is indicated by numeral 17 in the above-mentioned FIG. 6.

SUMMARY OF THE INVENTION

However, when the withstanding pressure characteristic of the completed piezoelectric vibrators which are manufactured in accordance with the flow of the conventional manufacturing method are checked, it has been found that some piezoelectric vibrators exhibit the fluctuation which exceeds a prescribed value. To be more specific, when the oscillation frequency and the resonance resistance value are measured by applying an external force of 10N or more to packages of the piezoelectric vibrators, it has been found that some piezoelectric vibrators exhibit the fluctuation which exceeds the prescribed value. A phenomenon in which the resonance frequency and the resonance resistance value are fluctuated in the vibrator due to a force applied from the outside is known as leaking of vibration. It is estimated that the withstanding pressure characteristic of the piezoelectric vibrator is influenced by the delicate displacement in the positional relationship attributed to the deformation of members in the bonding step or a strain attributed to a residual stress.

In view of the above-mentioned drawbacks, it is an object of the present invention to provide a piezoelectric vibrator which can sufficiently minimize the fluctuation of the oscillation frequency or the resonance resistance value even when a large static external force is applied to a package of the piezoelectric vibrator, a manufacturing method thereof, and an oscillator and en electronic equipment provided with the piezoelectric vibrator.

To overcome the above-mentioned drawbacks, the present invention provides a manufacturing method of piezoelectric vibrators which manufactures a plurality of piezoelectric vibrators by applying anodic bonding to a first wafer, a second wafer and a third wafer which are overlapped to each other with the first wafer sandwiched between the second wafer and the third wafer, and cutting the overlapped wafers at given positions, wherein the manufacturing method includes, before a bonding step in which the anodic bonding is performed, a vibrator piece frame forming step which integrally forms vibrator pieces and frames which are connected to one ends of the vibrator pieces and surround the vibrator pieces on the first wafer, a first recessed portion forming step which forms first recessed portions on a bonding surface side of the second wafer which faces the first wafer in an opposed manner, a second recessed portion forming step which forms second recessed portions on a bonding surface side of the third wafer which faces the first wafer in an opposed manner, and a groove forming step in which a plurality of grooves are formed in a non-bonding surface side of at least one of the second wafer and the third wafer at given positions. Here, the given positions imply positions and intervals which are set in conformity with respective sizes of predetermined piezoelectric vibrators.

Further, according to the present invention, a cross-sectional shape of the groove formed in the groove forming step is formed in a V shape and, when a plurality of piezoelectric vibrators are formed by cutting the overlapped wafers at the given positions, the overlapped wafers are cut at inclined surface portions of the V-shaped cross-sectional grooves along the V-shaped cross-sectional grooves. Here, the V-shaped cross-sectional shape includes an inverse trapezoidal shape which has a horizontal portion on a V-shaped bottom portion.

Further, according to the present invention, materials of the second wafer and the third wafer are soda-lime glass.

Further, according to the present invention, the vibrator pieces are of a tuning fork type.

Further, according to the present invention, a piezoelectric vibrator includes a vibrator piece, a frame which is integrally formed such that the frame is connected with one end of the vibrator piece and surrounds the vibrator piece, a lid which is bonded to the frame by anodic bonding and has a recessed portion at a position which faces the vibrator piece in an opposed manner, and a base which is bonded to the frame by anodic bonding on a side opposite to the lid and has a recessed portion at a position which faces the vibrator piece in an opposed manner, wherein a groove is formed at a given position in a non-bonding surface side of either one of the lid and the base with the frame before the anodic bonding, and the piezoelectric vibrator is cut along the groove after the anodic bonding.

Further, according to the present invention, there is provided an oscillator in which the above-mentioned piezoelectric vibrator is connected to an integrated circuit as an oscillation piece. To be more specific, the piezoelectric vibrator includes a vibrator piece, a frame which is integrally formed such that the frame is connected with one end of the vibrator piece and surrounds the vibrator piece, a lid which is bonded to the frame by anodic bonding and has a recessed portion at a position which faces the vibrator piece in an opposed manner, and a base which is bonded to the frame by anodic bonding on a side opposite to the lid and has a recessed portion at a position which faces the vibrator piece in an opposed manner, wherein a groove is formed at a given position in a non-bonding surface side of either one of the lid and the base with the frame before the anodic bonding, and the piezoelectric vibrator is cut along the groove after the anodic bonding.

Further, according to the present invention, there is provided an electronic equipment in which the above-mentioned piezoelectric vibrator is connected to a clock portion. To be more specific, the piezoelectric vibrator includes a vibrator piece, a frame which is integrally formed such that the frame is connected with one end of the vibrator piece and surrounds the vibrator piece, a lid which is bonded to the frame by anodic bonding and has a recessed portion at a position which faces the vibrator piece in an opposed manner, and a base which is bonded to the frame by anodic bonding on a side opposite to the lid and has a recessed portion at a position which faces the vibrator piece in an opposed manner, wherein a groove is formed at a position in a non-bonding surface side of either one of the lid and the base with the frame before the anodic bonding, and the piezoelectric vibrator is cut along the groove after the anodic bonding.

Further, according to the present invention, there is provided a radio clock in which the above-mentioned piezoelectric vibrator is connected to a filter portion. To be more specific, the piezoelectric vibrator includes a vibrator piece, a frame which is integrally formed such that the frame is connected with one end of the vibrator piece and surrounds the vibrator piece, a lid which is bonded to the frame by anodic bonding and has a recessed portion at a position which faces the vibrator piece in an opposed manner, and a base which is bonded to the frame by anodic bonding on a side opposite to the lid and has a recessed portion at a position which faces the vibrator piece in an opposed manner, wherein a groove is formed at a position in a non-bonding surface side of either one of the lid and the base with the frame before the anodic bonding, and the piezoelectric vibrator is cut along the groove after the anodic bonding.

According to the present invention, the manufacturing method of piezoelectric vibrators includes, before the bonding step in which three wafers are bonded to each other by the anodic bonding, the groove forming step in which the plurality of grooves are formed in the non-bonding surface side of at least one of the second wafer and the third wafer at given positions. With the provision of such a step, the rigidity of at least one of the second wafer and the third wafer is lowered due to the plurality of grooves formed before the anodic bonding. Accordingly, residual stresses attributed to thermal strains which are mutually influenced from each other at the time of bonding the second wafer and the third wafer to the first wafer are hardly generated and hence, the piezoelectric vibrators are hardly influenced by a static external force, whereby it is possible to manufacture the piezoelectric vibrators having the favorable withstanding pressure characteristic which can suppress the fluctuation of the oscillation frequency and the resonance resistance value.

Further, different from a conventional case which performs bevel cutting after bonding, the cost incurred due to a loss by performing the bevel cutting using a lid or a base wafer as a unit product can be limited to a loss of the lid wafer or the base wafer as a single part and hence, it is possible to reduce the overall manufacturing cost.

The grooves which are preliminarily formed in the lid wafer or the base wafer have the V-shaped cross section and, in the full cutting step, the wafers are cut on the inclined surfaces of the V-shaped cross-sectional grooves along the direction of the V-shaped cross-sectional grooves. Accordingly, it is possible to provide the structure in which ridge portions of outer surfaces of individual products which are separated from each other are beveled. Due to such structure, it is possible to impart a profile shape which exhibits the favorable resistance to chipping attributed to an impact or the like. Further, it is also possible to set a thickness of a corrosion resistance film applied to the products uniformly.

Further, the soda-lime glass is used as the material of the lid wafer and the base wafer. The soda-lime glass is popularly used as a glass for display, exhibits the stable product quality and can be manufactured as a low cost. Accordingly, it is possible to manufacture the piezoelectric vibrators with a high yield and at a low cost. Further, the mirror polishing of the soda-lime glass can be performed easily and hence, the reduction of a thickness (lowering of height) of the vibrators as finished products by reducing a thickness of the soda-lime glass has the large degree of freedom compared to a method which uses a ceramic package of existing sizes.

Further, by adopting a tuning fork type as a type of vibrator piece which is formed on the first wafer, the vibrator piece includes two vibration arms and is oscillated in a flexuous vibration mode. Since the oscillation frequency is a function of a length and a width of the vibration arm, it is possible to relatively freely select a thickness of the wafer. Accordingly, it is possible to manufacture the piezoelectric vibrators having a wide range of selection with respect to the application of the piezoelectric vibrators.

Further, when the above-mentioned piezoelectric vibrators are connected to the integrated circuits or clock portions of portable equipments as the oscillators and, further, when the piezoelectric vibrators are connected to filter portions of the radio clocks, the piezoelectric vibrators of the present invention exhibit the extremely small fluctuation of the resonance frequency and the resonance resistance value attributed to the influence of an external force. That is, the piezoelectric vibrators exhibit the sufficient electric characteristics of the vibrators against a tension or a compression force attributed to an ambient temperature change cycle applied to the vibrators after the piezoelectric vibrators are mounted on a board. Accordingly, it is possible to maintain the oscillators, the electronic equipments or the radio clocks at high accuracy over a long period.

BRIEF DESCRIPTION OF THE DRAWINGS

FIG. 5A and FIG. 5B are schematic views showing an example of the piezoelectric vibrator of the present invention, wherein FIG. 5A is a cross-sectional view taken along a line BB' in FIG. 5B as viewed from above and FIG. 5B is a cross-sectional view taken along a line AA' in FIG. 5A;

FIG. 6 is an exploded perspective view showing constitutional members of a surface-mount-type piezoelectric vibrator;

FIG. 7 is a schematic constitutional view showing the constitution of an oscillator according to a second embodiment;

DESCRIPTION OF THE PREFERRED EMBODIMENTS

Embodiments of the present invention are explained in detail in conjunction with attached drawings hereinafter.

Embodiment 1

Figure 1:
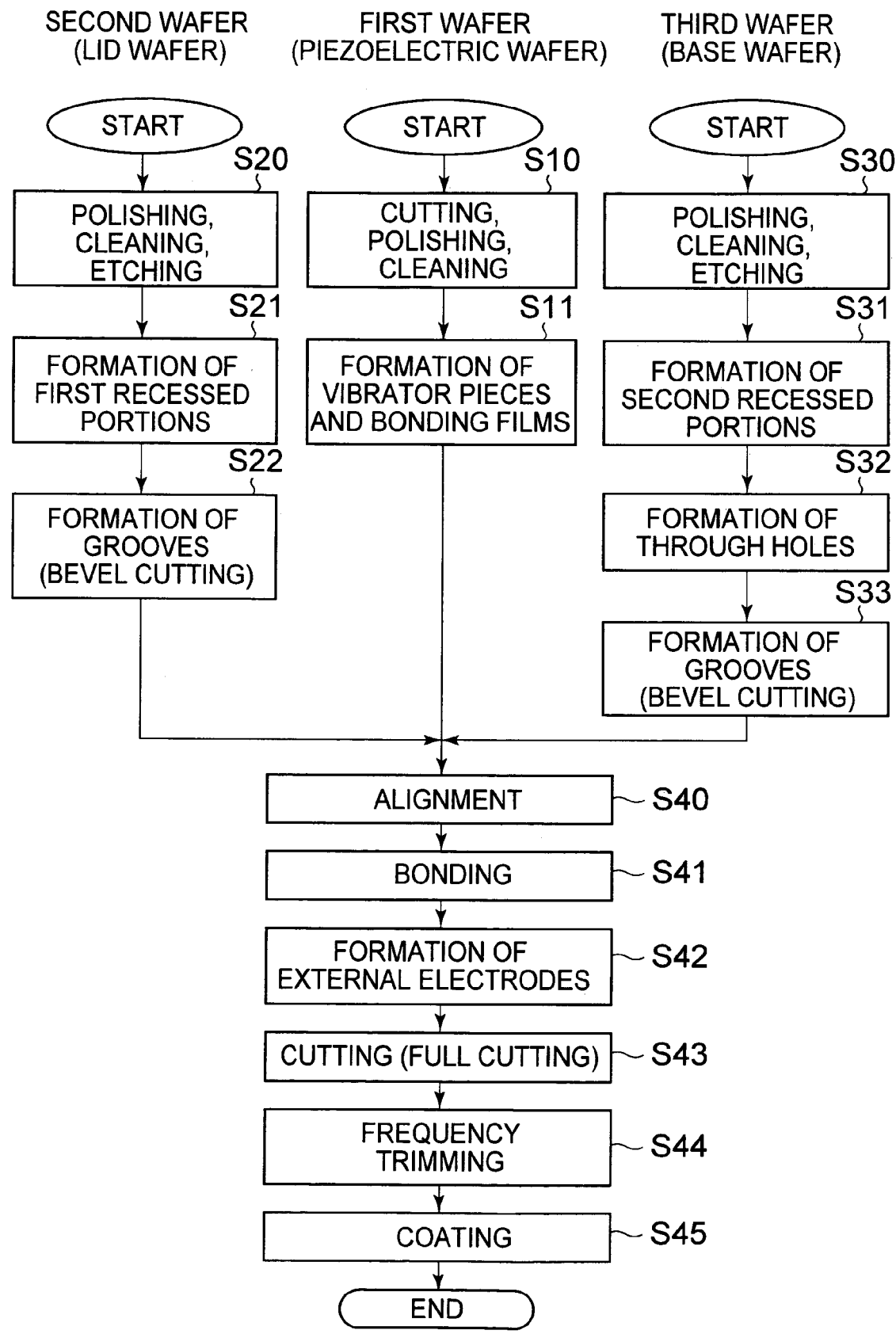
FIG. 1 is a flow chart showing an example of a manufacturing method of piezoelectric vibrators according to the present invention.
Figure 2:
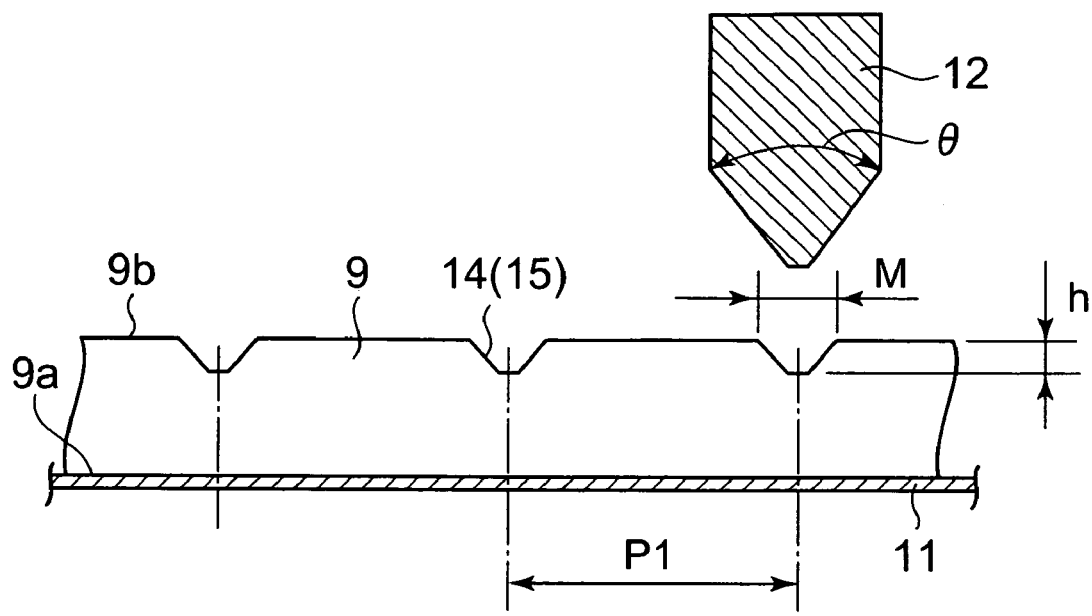
FIG. 2 is a schematic view showing a step for forming grooves in a second wafer in the manufacturing method of piezoelectric vibrators according to the present invention.
Figure 3:
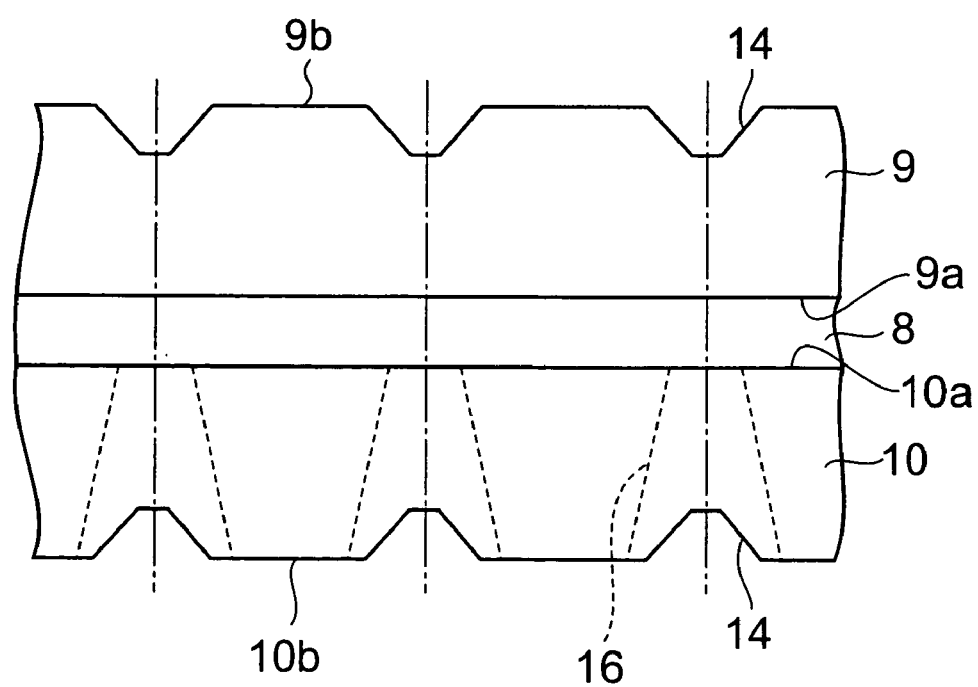
FIG. 3 is a schematic view showing a first wafer, the second wafer and a third wafer in an aligned state before anodic bonding in the manufacturing method of piezoelectric vibrators according to the present invention.
Figure 4:
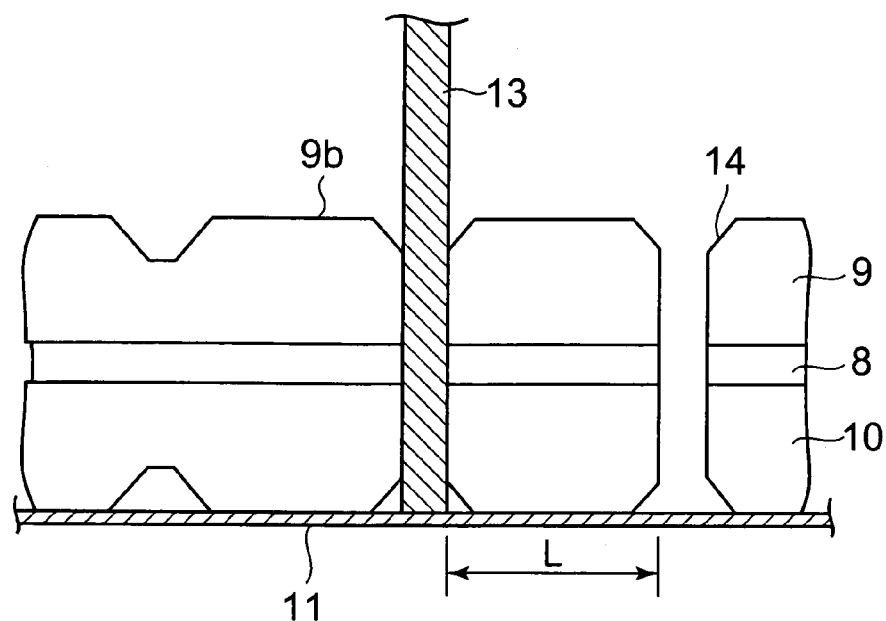
FIG. 4 is a schematic view showing a cutting step (a full cutting step) in the manufacturing method of piezoelectric vibrators according to the present invention.

A first embodiment of a manufacturing method of piezoelectric vibrators according to the present invention is explained in accordance with a manufacturing step flow chart shown in FIG. 1 and step charts shown in FIG. 2 to FIG. 4. Numerals indicating the constitutions are explained also in conjunction with an example of the piezoelectric vibrator shown in FIG. 5.

In this embodiment, the explanation will be made with respect to an example in which quartz crystal is used as a piezoelectric material and a tuning fork type is used as a shape of vibrator pieces. Further, although the explanation will be made with respect to a case in which wafers for forming a lid and a base are respectively prepared using soda-lime glass, the selection of the piezoelectric material and the respective materials of the lid and base may adopt the combination of quartz crystal and a material other than glass. Further, although a result of an experiment using samples in which a thickness of the quartz crystal wafer is approximately 130 μm and a thickness of the glass wafer is 400 μm is described, it is needless to say that the thicknesses of the members are not limited to these numerical values.

Figure 10:
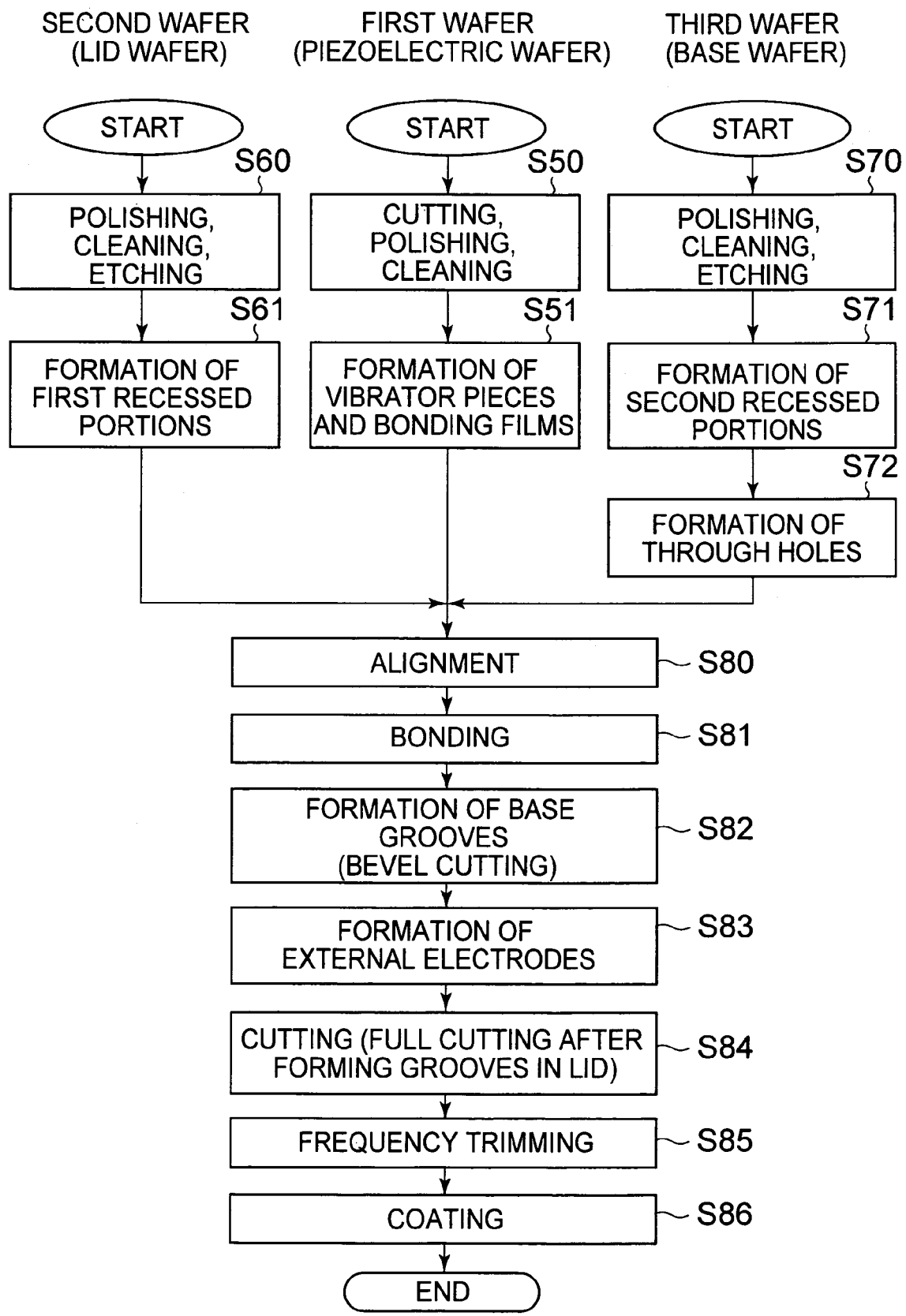
FIG. 10 is a flow chart of a conventional manufacturing method of piezoelectric vibrators.

A step flow of the piezoelectric (quartz crystal) wafer 8 which constitutes a first wafer is equal to a conventional manufacturing step flow shown in FIG. 10. The quartz crystal wafer 8 which is formed by cutting a quartz crystal lumbered ore having a diameter of 3 inches at a given cutting angle using a wire saw has both surfaces thereof finished into a mirror surfaces by way of grinding consisting of lapping and polishing and cleaning (step 10). Subsequently, a vibrator piece frame forming step is performed. That is, in the surface of the quartz crystal wafer 8, a plurality of tuning-fork-type vibrator pieces 1 having exciting electrode films are formed by chemical treatment such as etching. On front and back surfaces of the frame 2 which is integrally connected with one end of the vibrator piece 1 and surrounds a periphery of the vibrator piece 1, a pattern of the bonding film 3 for performing the anodic bonding of the second and third wafers is formed (step 11).

With respect to a lid wafer 9 which constitutes a second wafer, soda-lime glass is prepared and, thereafter, the polishing is applied to the soda-lime glass to reduce a thickness of the soda-lime glass to a given value and, thereafter, the soda-lime glass is cleaned. Next, an uppermost surface layer which is degenerated by machining is removed by etching or the like (step 20). Subsequently, a first recessed portion forming step is performed. That is, a plurality of first recessed portions 4 are formed in a bonding surface 9a side of the lid wafer 9 by chemical treatment using a fluoric acid (system) etchant in a state that the mechanical deformation attributed to the oscillation of the vibrators is not obstructed (step 21). A plurality of these first recessed portions 4 are formed corresponding to the positions of vibrator pieces 1 formed on the quartz crystal wafer 8. Then, a next step is explained in conjunction with FIG. 2.

FIG. 2 is a schematic view showing a bevel cutting step of the second wafer (lid wafer) according to the present invention. As shown in FIG. 2, a bonding surface 9a side of the lid wafer 9 is adhered to a dicing tape 11, and the bevel cutting step is performed at an interval size equal to a cutting interval size of the vibrator using a dicing saw not shown in the drawing. Here, the cutting interval size of the vibrator is set P1 with respect to the long side. The cutting interval size of the short side is set to an equal interval in the direction perpendicular to a paper surface. The bevel cutting is performed by feeding the lid wafer 9 which is fixed to a dicing table not shown in the drawing with respect to the rotating dicing blade 12. It is preferable to adopt the dicing blade 12 having a tool angle $\theta$ of 90 degrees. It is because that such a dicing blade 12 can impart a beveling portion 15 of 45 degrees to a ridge portion of the lid after cutting. Further, a cutting depth h of the dicing blade 12 is set to approximately 100 μm thus forming a groove 14 having an inversely trapezoidal cross section having an opening width M of approximately 280 μm. The cross-sectional shape of the groove 14 may be an inverse triangular shape having no horizontal surface on a groove bottom portion. A feeding speed of the dicing table is set to approximately 25 to 30 mm/second. In this manner, a mesh constituted of a plurality of grooves 14 is formed on a non-bonding face 9b side of the lid wafer 9 (step 22).

With respect to a base wafer 10 which constitutes a third wafer, soda-lime glass having the same size as the soda-lime glass used for forming the lid is prepared and, thereafter, the polishing is applied to the soda-lime glass to reduce a thickness of the soda-lime glass to a given value and, thereafter, the soda-lime glass is cleaned. Next, an uppermost surface layer which is degenerated by machining is removed by etching or the like (step 30). Subsequently, a second recessed portion forming step is performed. That is, second recessed portions 5 are formed in a bonding surface 10a side of the base wafer 10 by chemical treatment using a fluoric acid (system) etchant in a state that the mechanical deformation attributed to the oscillation of the vibrators is not obstructed (step 31). Next, through holes 16 for forming external electrodes (see FIG. 3) are formed by blast forming (step 32). Subsequently, in the same manner as the lid wafer 9, a bonding surface 10a side of the base wafer 10 is adhered to a dicing tape 11, the base wafer 10 is set on the dicing saw, and the bevel cutting step is performed at the cutting interval sizes P1, P2 of the vibrators. It is preferable to adopt the dicing blade 12 having a tool angle $\theta$ of 90 degrees. It is because that such a dicing blade 12 can impart a beveling portion 15 of 45 degrees to a ridge portion of the base after cutting. Further, a cutting depth h of the dicing blade 12 is set to approximately 100 μm in the same manner as the lid wafer 9 and an opening width M is set to approximately 280 μm thus forming a groove 14 having an inversely trapezoidal cross section. In this manner, a mesh constituted of a plurality of grooves 14 is formed on a non-bonding face 10b side of the base wafer 10 (step 33).

Figure 11:
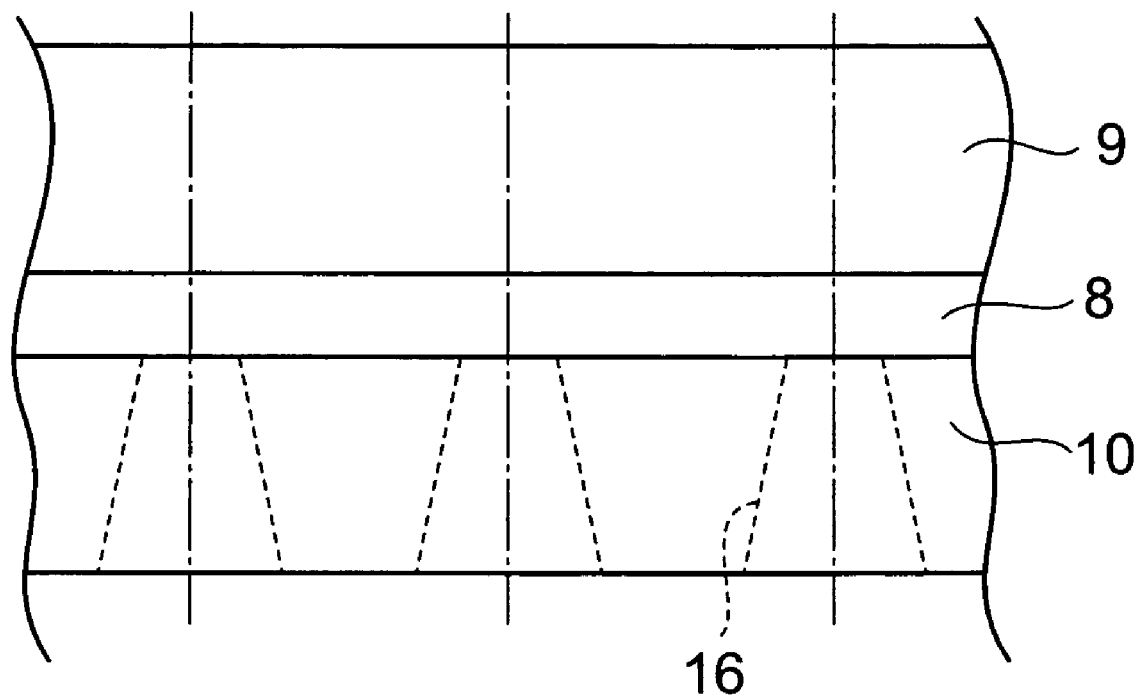
FIG. 11 is a schematic view showing a first wafer, the second wafer and a third wafer in an aligned state before anodic bonding in the conventional manufacturing method of piezoelectric vibrators.

Subsequently, an alignment step is performed. In the alignment step, using a surface in which the mesh constituted of the grooves 14 is formed as a non-bonding surface, the alignment of the lid wafer 9, the quartz crystal wafer 8 and the base wafer 10 is performed. The alignment of three wafers in the alignment step is performed using an aligner while using alignment marks which are preliminarily formed on the respective wafers as the reference (step 40). FIG. 3 is the drawing which shows a state in which three wafers are aligned. In FIG. 3, the grooves 14 having an inversely trapezoidal cross section are formed in the lid wafer 9 and the base wafer 10 respectively and these wafers 9, 10 are overlapped to each other with the quartz crystal wafer 8 sandwiched therebetween. Further, on the base wafer side, through holes 16 indicated by a broken line are formed. Here, the state shown in FIG. 3 in which three wafers are aligned with each other and a state in which three wafers are aligned as explained previously in conjunction with background art and shown in FIG. 11 are compared to each other. In case of the present invention shown in FIG. 3, the mesh constituted of the plurality of grooves 14 is preliminarily formed on the respective non-bonding surfaces 9b, 10b of the lid wafer 9 and the base wafer 10.

Next, after the completion of the positioning, the wafer is fed to the bonding step. In the bonding step, the wafer is set on an anodic bonding jig and the anodic bonding is performed. In the anodic bonding, a given bonding temperature and a given applying voltage are held. After detecting an end point of bonding, the wafer is gradually cooled in the inside of the bonding device and is returned to a normal temperature (step 41). Due to such a bonding step, the plurality of tuning-fork-type respective vibrator pieces 1 formed on the quartz crystal wafer 8 assume a state in which the quartz crystal wafer 8 is hermetically sealed in the inside of the upper and lower wafers and the frame 2. Next, in a state that three wafers are laminated to each other by the anodic bonding, the base wafer 10 is covered with a metal mask having a given opening pattern, and a layer pattern formed of a metal thin film which constitutes an external electrode is formed by sputtering or a vapor deposition method (step 42). The metal thin film layer is formed on a bottom surface (non-bonding surface 10b) of the base wafer 10, an inner surface of the through hole. 16, and surfaces of the grooves 14 which form beveling portions 15 having an angle of 45° after cutting.

Next, as shown in FIG. 4, one-side surfaces (non bonding surfaces) of three wafers which are bonded to each other are laminated to the dicing tape 11 and are again set on the dicing saw. In accordance with the cutting interval sizes P1 and P2 at which the grooves are formed by bevel cutting, the full cutting is performed using the dicing blade 13 having a thickness smaller than the opening width M of the grooves thus separating the individual vibrators by cutting (step 43). The feeding speed of the dicing table in the full cutting is set to approximately 8 to 10 mm/second. Longitudinal and lateral profile sizes of the individually separated vibrator are sizes obtained by subtracting a thickness amount of the blade from the cutting interval sizes P1 and P2, while the long-side size of the vibrator is indicated by L in FIG. 4. The depiction of the short-side size is omitted from the drawing.

Here, in performing the full cutting, the lid wafer 9 side may be laminated to the dicing tape 11 or the base wafer 10 side may be laminated to the lid wafer 9 side. However, it is preferable that a sharing force applied to the three bonded wafers of the dicing blade 13 is applied to the lid wafer 9 side having no through holes 16 from the base wafer 10 side in which the through holes 16 are formed. The reason is that when the sharing force is applied in the opposite direction, there arises a possibility that a portion of the bonding film 3 which is exposed to a bottom portion of the through hole 16 is peeled off. When the portion of the bonding film 3 is peeled off, the bonding film 3 per se corrodes from the peeled portion thereof during a long period thus lowering the hermetic property and changing the properties of the piezoelectric vibrators.

The plurality of piezoelectric vibrators which are individually separated from each other by the full cutting are housed in a tray not shown in the drawing and, thereafter, YAG laser beams are introduced to the piezoelectric vibrators individually from the lid 6 side of the glass or the base 7 side which is made of a transparent body. The YAG laser beams evaporate metal thin films for trimming frequency which are preliminarily formed on the vibrator pieces 1 so as to trim the piezoelectric vibrators within a given frequency range (step 44). Thereafter, a corrosion resistance film is applied to a surface of the piezoelectric vibrator housing by coating except for an external terminal portion thus completing the vibrator which enhances the environment resistance performance (step 45).

Figure 5A:
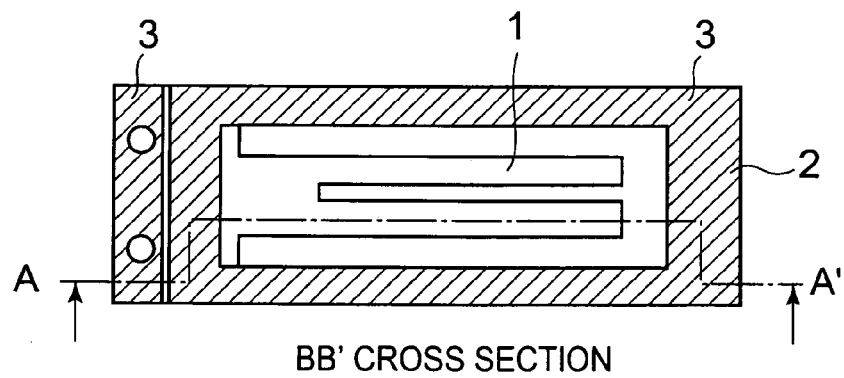
Figure 5B:
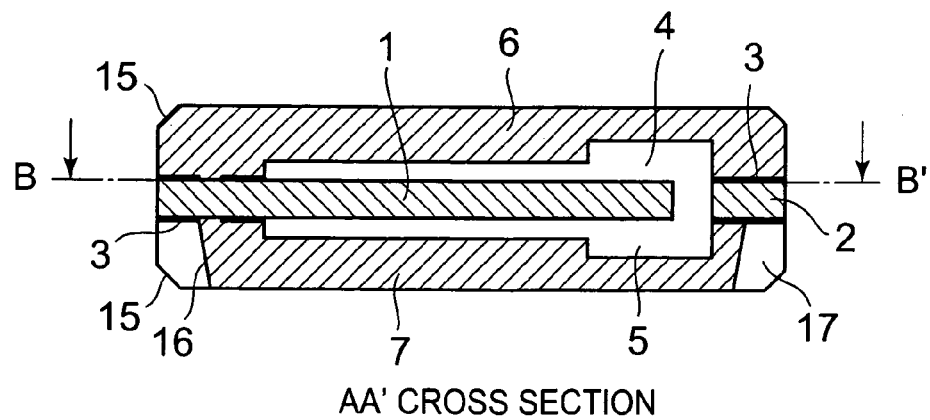

FIG. 5A and FIG. 5B show the structure of the tuning-fork-type quartz crystal vibrator which is manufactured in the above-mentioned manner. FIG. 5A is a schematic view taken along a line BB' shown in FIG. 5B in which a cross section along the line BB' is observed from the direction indicated by an arrow and shows one vibrator out of a large number of vibrators formed on the quartz crystal wafer. The line BB' shows an interface between the quartz crystal and the lid. FIG. 5B shows a cross section taken along a line AA' in FIG. 5A.

Bonding films 3 are formed on front and rear surfaces of the frame body 2 which is integrally connected with one end of the tuning-fork-type vibrator piece 1. Here, an electrode pattern formed on a surface of the vibrator piece is omitted from the drawing. The lid 6 is bonded to the above-mentioned frame 2 by anodic bonding by way of the bonding film 3 and includes a first recessed portion 4 at a position thereof which faces the vibrator piece 1 in an opposed manner. Further, the lid 6 has the beveling portion 15 of 45 degrees attributed to the V-shaped groove formed before the anodic bonding. On the other hand, the base 7 is bonded to the above-mentioned frame 2 by anodic bonding by way of the bonding film 3 on a side opposite to the lid 6 and includes a second recessed portion 5 at a position thereof which faces the vibrator piece 1 in an opposed manner. Further, the base 7 has the beveling portion 15 of 45 degrees attributed to the V-shaped groove formed before the bonding. Further, at an end portion of the base 7, an external terminal connecting portion 17 is formed on an inner surface of the through hole before cutting and constitutes an external electrode. Although not shown in the drawing, a corrosion resistance film is applied to a surface of the vibrator by coating except for a bottom surface of the base.

Next, a result of an experiment which is performed for confirming the withstanding pressure characteristic of piezoelectric vibrators manufactured by the manufacturing method of the piezoelectric vibrator according to the above-mentioned present invention is explained in conjunction with Table 1 and Table 2.

TABLE 1

Withstanding pressure characteristic of oscillation frequency (frequency fluctuation characteristic)

|  | present invention | | | conventional method | | |
|---|---|---|---|---|---|---|
| load (N) | 10 | 20 | 30 | 10 | 20 | 30 |
| maximum value (ppm) | 0.3 | 0.3 | 0.3 | 0.6 | 1.9 | 2.2 |
| minimum value (ppm) | −0.3 | −0.3 | −0.3 | −0.9 | −0.6 | −0.3 |
| average value (ppm) | 0.0 | 0.0 | −0.1 | 0.0 | 0.1 | 0.4 |
| standard deviation (ppm) | 0.12 | 0.15 | 0.17 | 0.25 | 0.48 | 0.70 |
| process capability index | 7.9 | 6.6 | 5.7 | 4.0 | 2.0 | 1.3 |

TABLE 2

Withstanding pressure characteristic of resonance resistance value (fluctuation characteristics of resonance resistance value)

|  | present invention | | | conventional method | | |
|---|---|---|---|---|---|---|
| load (N) | 10 | 20 | 30 | 10 | 20 | 30 |
| maximum value (kΩ) | 0.2 | 0.2 | 0.2 | 0.2 | 0.3 | 0.2 |
| minimum value (kΩ) | −1.5 | −0.6 | −0.2 | −1.9 | −2.0 | −2.3 |
| average value (kΩ) | −0.3 | 0.1 | 0.0 | −0.4 | −0.4 | −0.5 |
| standard deviation (kΩ) | 0.35 | 0.15 | 0.09 | 0.60 | 0.63 | 0.69 |
| process capability index | 2.6 | 6.8 | 10.7 | 1.4 | 1.4 | 1.2 |

Table 1 shows a result obtained by comparatively measuring values of the oscillation frequencies fluctuated from initial values (fluctuated values) as the withstanding pressure characteristic between the vibrators manufactured by the manufacturing method of the present invention and the vibrators manufactured by the conventional manufacturing method.

Table 2 shows a result obtained by comparatively measuring values of the resonance resistance values from initial values (fluctuated values) as the withstanding pressure characteristic between the vibrators manufactured by the manufacturing method of the present invention and the vibrators manufactured by the conventional manufacturing method.

With respect to the piezoelectric vibrators used in the experiment, both of the piezoelectric vibrators manufactured by the manufacturing method of the present invention and the vibrators manufactured by the conventional manufacturing method are formed of a tuning-fork-type quartz crystal vibrator. Further, the respective experiments are performed by setting an external force to 10N, 20N, 30N and comparison results which are obtained when the loads are shifted are also shown. The number of samples is 30 in respective experiments. The process capability indexes are attached to respective tables. In calculating the process capability indexes, the process capability index is calculated by setting an upper-and-lower-limit standard to ±3 ppm in case of the fluctuated value of the oscillation frequency and the process capability index is calculated by setting an upper-and-lower-limit standard to ±3 kΩ in case of the fluctuated value of the resonance resistance value. The process capability index is an index which measures the stability of the manufacturing step and is calculated based on the average value, the standard deviation value and the standard value and it is determined that manufacturing step is stable when the value is 1.67 or more.

In table 1, against the external force of any one of 10N, 20N, 30N, the fluctuated values of the oscillation frequencies are held within ±0.3 ppm and hence, the oscillation frequencies of the samples are sufficiently stable. Further, numerical values of the standard deviations (ppm) of the fluctuated values are respectively 0.12, 0.15, 0.17 against the respective external force and exhibit small irregularities. As a result, the step capability indexes respectively become 7.9, 6.6, 5.7 and hence, the process capability indexes are sufficiently larger than 1.67 which constitutes the judgment indicator.

On the other hand, with respect to the samples manufactured by the conventional manufacturing method, the maximum values of the fluctuated values respectively assume large values of 1.9 ppm and 2.2 ppm when the values of the external force become 20N and 30N. Further, when the value of the external force is 30N, the standard deviation of the fluctuated value assumes a large value of 0.70 ppm and hence, the fluctuated value is largely fluctuated. Accordingly, the process capability index is also 1.3 when the external force is 30N, and hence, the step capability index is lower than the judgment indicator. In this manner, the large difference is recognized between the manufacturing method of the present invention and the conventional manufacturing method with respect to the withstanding pressure characteristic of the resonance frequency.

Next, the fluctuated values of the resonance resistance values in Table 2 are studied. In the samples of the present invention, only one sample exhibits the change of 1.5 kΩ when the external force is 10N. However, the irregularities of the resonance resistance value of other samples are sufficiently small, wherein the process capability index exhibits 2.6 and, therefore, exceeds the judgment indicator value. When the external forces of 20N and 30N are applied, the fluctuated values per se and the standard deviations of the fluctuated values are sufficiently small and hence, the process capability indexes exhibit the sufficiently large values.

On the other hand, with respect to the samples manufactured by the conventional method, both of the fluctuated values of the resonance resistance values and the standard deviations of the fluctuated values are large against any external force and hence, it is estimated that so-called leaking-of-vibration phenomenon is generated. The process capability index also assumes a value which falls within a range of 1.2 to 1.4 and hence, the process capability is below the judgment indicator value. In this manner, the large difference is recognized between the manufacturing method of the present invention and the conventional manufacturing method also with respect to the withstanding pressure characteristic of the resonance resistance value.

From the experimental results shown in Table 1 and Table 2, the piezoelectric vibrators according to the present invention exhibit the sufficiently small fluctuations of oscillation frequency and resonance resistance value against any load ranging from 10N to 30N and can suppress the irregularities compared to the vibrators manufactured by a conventional method whereby the process capability is largely enhanced. It is evident that the withstanding pressure characteristic is remarkably improved by the present invention.

The above-mentioned improvement is estimated to be derived from following reasons. An electrostatic attractive force which is generated between the bonding film on the quartz crystal wafer and glass which faces the bonding film in an opposed manner is increased corresponding to the elevation of the mirror finishing level of the bonding film and the glass and the decrease of a gap between the bonding film and the glass and, eventually, the bonding film and the glass come into contact with each other. Usually, the surface roughness of the bonding film and the surface roughness of the glass differ depending on positions above the wafer and hence, it is construed that the anodic bonding is not started uniformly between the bonding film and the glass but is generated in scattered places spatially and the bonding surface is gradually spread. In the anodic bonding process, the quartz crystal wafer and the glass are heated, wherein a compression stress is applied to the quartz crystal wafer which has the relatively large thermal expansion coefficient and a tensile strength acts on the glass side which exhibits the small thermal expansion coefficient. To focus on the thickness direction of the glass, the glass receives a tension and extends in a plane (within a xy plane) and hence, the glass is contracted in the thickness direction (z direction) correspondingly. When the anodic bonding is started uniformly and advances within the wafer plane, the glass uniformly generates strain in the thickness direction. However, in the actual anodic bonding, as described previously, the anodic bonding is started and spreads at completely scattered or separate locations and hence, the local attractive forces are applied to the glass at the respective locations and these locations are changed with a lapse of time. Under such circumstances, in the manufacturing method of the present invention, when the bevel cutting is applied to the surface of the glass to provide the difference in thickness of the glass, the rigidity of the glass is lowered and hence, the glass is relatively easily deformed whereby the relative positional displacement between the piezoelectric material and the glass becomes small and the irregularities are decreased. It is estimated that the withstanding pressure characteristic is enhanced due to the result of such a phenomenon.

Further, although the bevel cutting which is performed before the anodic bonding may be applied to either one of the lid wafer and the base wafer, it is more preferable to apply the bevel cutting to both of the lid wafer and the base wafer due to the reason set forth above.

Here, apart from the improvements on the manufacturing steps, improvements on designs related to the selection of materials and the modifications of shape and the like and advantageous effects obtained by such improvements are explained hereinafter.

In the combination of the soda-lime glass which constitutes the material of the lid wafer and the base wafer and the quartz crystal which constitutes the piezoelectric material, the thermal expansion coefficients of both materials largely differ from each other (the thermal expansion coefficient of the quartz crystal being 13.7 ppm/° C. and the thermal expansion coefficient of the soda-lime glass being 8.5 ppm/° C.). However, the bonding characteristic of the above-mentioned combination of the materials satisfies the bonding strength, the hermetic characteristic, the bending characteristic, the falling impact characteristic, the vibration resistance characteristic, the environment resistance characteristic (use in high-temperature/high humidity, exposure under high temperature, thermal shock and the like) which the piezoelectric vibrator is required to possess thus realizing the utilization of the inexpensive soda-lime glass as a profile package material. On the other hand, thermal expansion coefficients of $LiTaO_3$ and $LiNbO_3$ are respectively 16.1 ppm/° C. and 15.4 ppm/° C. The above-mentioned piezoelectric material can, in the same manner as the case which uses the quartz crystal, select the soda-lime glass as the materials of the lid wafer and the base wafer.

Further, by using the tuning-fork-type vibrator as the piezoelectric vibrator which is formed on the first wafer, it is possible to broaden a range of selection of applications. For example, first of all, it is possible to use the piezoelectric vibrator as a quartz crystal tuning-fork-type vibrator which includes two vibration arms, oscillates in a flexuous vibration mode and is popularly used as a time source. Further, it is possible to use the piezoelectric vibrator as a quartz crystal angular velocity sensor used in the car navigation which has the structure of the tuning-fork-type vibrator. Further, it is possible to use the piezoelectric vibrator as an angular velocity sensor which has the structure of tuning-fork-type vibrator which is formed of a piezoelectric material such as LiNbO3, the LiTaO3, langasite or the like which exhibits the large electro-mechanical coupling coefficient and is suitable for the miniaturization of the elements. Still further, it is possible to use the piezoelectric vibrator as a tuning-fork-type vibrator which is capable of performing the oscillation in atmosphere using LiTaO3. In such a tuning-fork-type vibrator, the oscillation frequency is a function of a length and a width of the oscillation arm and the tuning-fork-type vibrator has the characteristic to relatively freely select the thickness of the wafer.

For example, in the manufacture of the, quartz crystal tuning-fork-type vibrator used as the time source, a thickness of the wafer on which the vibrator piece is formed may be selected within a range of approximately 50 μm to 150 μm when a profile of the vibrator piece is formed by etching using a solvent of fluoric acid or the like in the inside of the wafer. Accordingly, it is possible to decide the thickness of the wafer by taking abilities of various steps such as a yield of polishing step of wafers and other steps such as etching, cleaning and the like into consideration. The fact that the thickness of wafer has some degree of freedom facilitates the increase of the diameter of the wafer and hence, a large number of vibration pieces can be formed whereby the possibility that the manufacturing cost of the vibration pieces can be lowered is increased.

To the contrary, although an AT vibrator may be categorized as the same quartz crystal vibrator as the tuning-fork-type vibrator, the AT vibrator differs from the tuning-fork-type vibrator in a vibration mode. That is, the vibration mode of the AT vibrator adopts the thickness shear where the oscillation frequency becomes a function of the thickness of the wafer and hence, when the oscillation frequency is determined, the thickness of the wafer is substantially determined. For example, in case of the AT vibrator of 48 MHz which is used in a portable liquid-crystal television receiver set, the thickness of the quartz crystal vibration piece is approximately 30 μm. Polishing, cleaning or etching of such a thin wafer having a large diameter of, for example, 3 inches gives rise to the frequent breaking of the wafer and hence, it is difficult to manufacture such a wafer using the currently available manufacturing steps. Further, the fact that the thickness of the wafer differs for every frequency of the product requires time and efforts for the control of steps and the inventory of the wafers. Although it may be possible to adopt a method which uses the so-called mesa structure in which a frame portion has a thickness of 130 μm and only a thickness of the vibration piece is decreased, there arises a possibility that a manufacturing cost is pushed up due to the increase of the number of steps. To the contrary, as mentioned previously, the adoption of the tuning-fork-type vibrator as the vibrators formed on the first wafer makes full use of the characteristic that the tuning-fork-type vibrator possesses that the thickness of the wafer is irrelevant to the oscillation frequency in principle.

Further, the piezoelectric vibrators which are manufactured in this embodiment are stable against an external force generated attributed to the difference in thermal expansion coefficient between the piezoelectric vibrators and a mounting board and hence, the fluctuation of the resonance frequency and the resonance resistance value can be suppressed. Accordingly, the piezoelectric vibrators can satisfy the characteristic of the vibrator in a wider temperature range.

Embodiment 2

As a second embodiment of the present invention, an oscillator in which the above-mentioned piezoelectric vibrator is connected to an integrated circuit as an oscillator is explained in conjunction with FIG. 7.

FIG. 7 is a rough schematic view showing the constitution of a tuning-fork-type-quartz crystal oscillator and is a plan view showing a surface-mounting-type piezoelectric vibrator which makes use of the above-mentioned tuning-fork-type quartz crystal vibrator according to the present invention.

In FIG. 7, the tuning-fork-type quartz crystal vibrator 51 is set at a given position on a board 52, while an integrated circuit for oscillator indicated by numeral 53 is arranged close to the quartz crystal vibrator. Further, an electronic component 54 such as a capacitor is also mounted on the board 52. These respective parts are electrically connected with each other through a wiring pattern not shown in the drawing. The mechanical vibrations of a piezoelectric vibrator piece of the tuning-fork-type quartz crystal vibrator 51 are converted into electric signals due to the piezoelectric characteristic which the quartz crystal possesses and the electric signals are inputted to the integrated circuit 53. In the inside of the integrated circuit 53, the signal processing is performed and frequency signals are outputted and hence, the integrated circuit 53 functions as an oscillator. These respective constitutional parts are molded by resin not shown in the drawing. By selecting, for example, a RTC (Real Time Clock) module or the like as the integrated circuit 53, the integrated circuit 53 also has, besides a function of a single function oscillator for clock, a function of controlling an operation day and time of the oscillator and an external equipment and a function of providing information on time and calendar to a user.

With the use of the piezoelectric vibrator manufactured by the manufacturing method of the present invention as the oscillator, the oscillation frequency and the resonance resistance value are hardly influenced by the external force and the vibrator exhibits the sufficient stable electric characteristic against a tension or a compression force which are applied to the vibrator after being mounted on the board attributed to an ambient temperature change cycle. Accordingly, the oscillator exhibits the small fluctuation of the electric characteristic even in the environmental atmosphere having the large temperature difference and hence, it is possible to provide the oscillator which exhibits the stable oscillation frequency over a long period.

Embodiment 3

Figure 8:
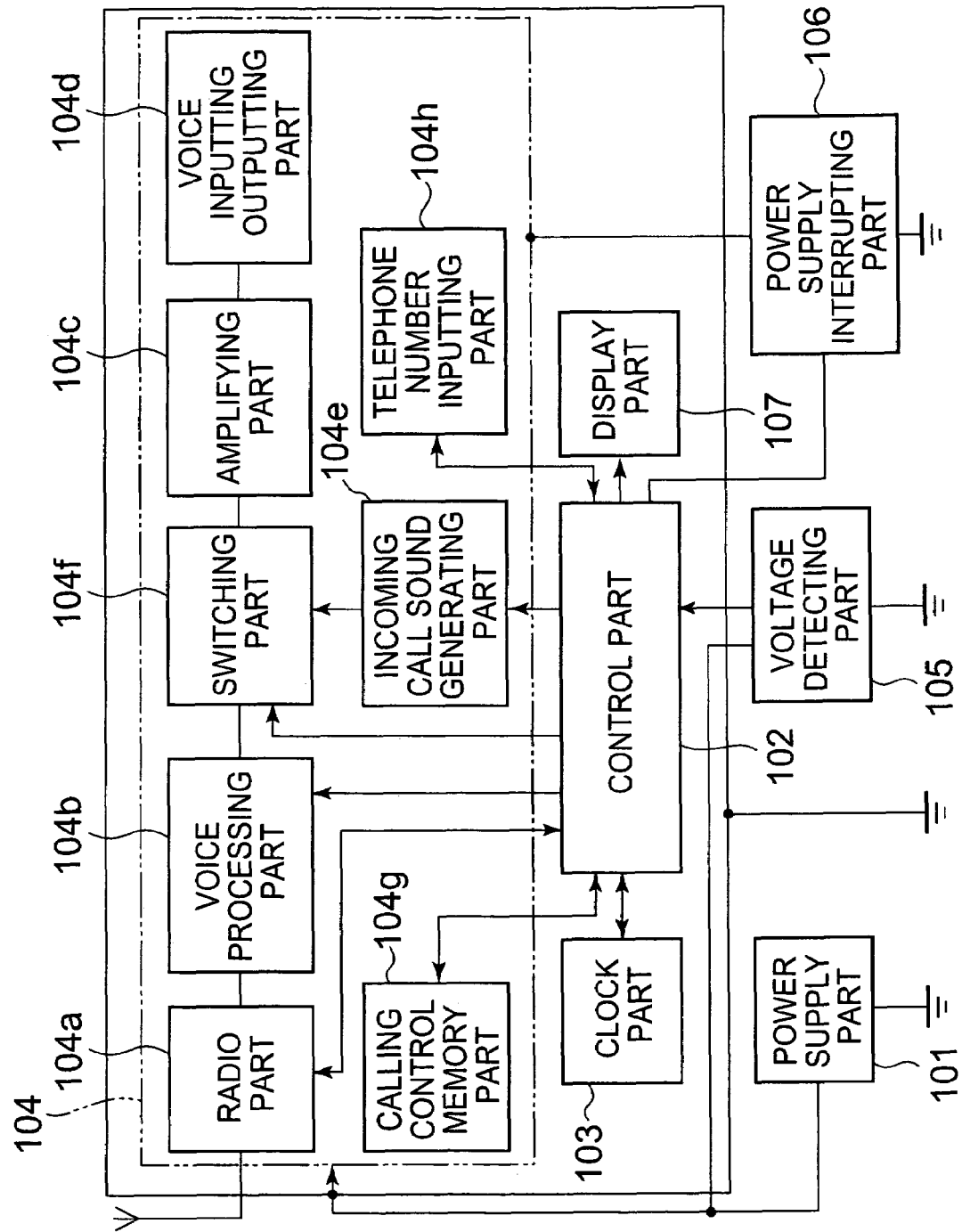
FIG. 8 is a block diagram functionally showing one example of the constitution of an electronic equipment according to a third embodiment.

As a third embodiment of the present invention, an electronic equipment used in a state that the above-mentioned piezoelectric vibrator is connected to a clock part is explained in conjunction with FIG. 8. As an example of the electronic equipment, a preferred embodiment on a portable information equipment represented by a mobile phone is explained in detail.

First of all, as a premise, the portable information equipment according to this embodiment is a development or an improvement of a wrist watch of the related art. The portable information equipment resembles the wrist watch in appearance, arranges a liquid crystal display on a portion thereof which corresponds to a dial plate, and can display a current time and the like on a screen of the display. In using the portable information equipment as a communication device, the portable information equipment is removed from a wrist and a user can perform the communication in the same manner as a mobile phone of the related art using a speaker or a microphone incorporated in the inside of a band portion. However, the portable information equipment is drastically miniaturized and is light-weighted compared to the conventional mobile phone.

Next, the functional constitution of the portable information equipment according to this embodiment is explained in conjunction with the drawing. FIG. 8 is a block diagram showing the constitution of the portable information equipment according to this embodiment functionally.

In FIG. 8, numeral 101 indicates a power supply part which supplies electricity to respective functional parts described later. To be more specific, the power supply part 101 is embodied by a lithium ion secondary cell. To the power supply part 101, a control part 102, a clock part 103, a communication part 104, a voltage detection part 105 and a display part 107 are connected in parallel to each other, wherein the electricity is supplied to the respective functional parts from the power supply part 101.

The control part 102 controls the respective functional parts described later and performs an operational control of the whole system such as the transmission and reception of vocal data, the measurement and display of the current time and the like. The control part 102, to be more specific, is embodied by programs which are preliminarily written in a ROM, a CPU which reads out and executes the programs, a RAM which is used as a work area of the CPU and the like.

A clock part 103 is constituted of an integrated circuit which incorporates an oscillation circuit, a register circuit, a counter circuit, an interface circuit and the like therein and the tuning-fork-type quartz crystal vibrator which is described in the embodiment 1. The mechanical vibrations of the tuning-fork-type quartz crystal vibrator are converted into electric signals due to the piezoelectric characteristic which the quartz crystal possesses and the electric signals are inputted to the oscillation circuit which is constituted of a transistor and a capacitor. An output of the oscillation circuit is binarized and the binarized value is counted by the register circuit and the counter circuit. The transmission and reception of signals are performed between the clock part 103 and the control part 102 through the interface circuit and the current time, the current date or the calendar information is displayed on the display part 107.

The communication part 104 functions in the same manner as the mobile phone of the related art and is constituted of a radio part 104a, a voice processing part 104b, an amplifying part 104c, a voice inputting/outputting part 104d, an incoming call sound generating part 104e, a switching part 104f, a calling memory part 104g and a telephone number inputting part 104h.

The radio part 104a transmits and receives various kinds of data such as vocal data with a base station via an antenna. The voice processing part 104b codes and decodes the vocal signal inputted from the radio part 104a or the amplifying part 104c described later. The amplifying part 104c amplifies the signal inputted from the voice processing part 104b or the voice inputting/outputting part 104d described later to a given level. The voice inputting/outputting part 104d is, to be more specific, a speaker or a microphone and amplifies an incoming call sound or a phone sound or collects a speaker's voice.

The incoming call sound generating part 104e generates an incoming call sound in response to calling from the base station. The switching part 104f changes over the connection between the amplifying part 104c and the voice processing part 104b to the connection between the amplifying part 104c and the incoming call generating part 104e only at the time of receiving the incoming signal and hence, the generated incoming call sound is outputted to the inputting/outputting part 104d through the amplifying part 104c.

Here, the calling control memory 104g stores a program related to the outgoing/incoming calling control of the communication. Further, the telephone number inputting part 104h, to be more specific, is constituted of number keys from 0 to 9 and some other keys and is served for inputting the telephone number of a telephone call destination or the like.

The voltage detecting part 105, when a voltage applied to the respective functional parts including the control part 102 from the power supply part 101 becomes lower than a given value, detects the lowering of the voltage and notifies the lowering of the voltage to the control part 102. The given voltage value is a value which is preliminarily set as a minimum voltage for operating the communication part 104 in a stable manner and is a voltage of approximately 3V, for example. The control part 102, upon receiving the notification of lowering of the voltage from the voltage detecting part 105, inhibits the operations of the radio part 104a, the voice processing part 104b, the switching part 104f and the incoming call sound generating part 104e. Particularly, the stopping of the operation of the radio part 104a which exhibits the large power consumption is indispensable. Simultaneously with such stopping of the operations, a message that the communication part 104 is inoperable due to the shortage of the remaining battery amount is displayed on the display part 107.

Due to the cooperative operation of the voltage detecting part 105 and the control part 102, it is possible to inhibit the operation of the communication part 104 and it is also possible to display the inhibition of the operation of the communication part 104 on the display part 107.

In this embodiment, by providing a power supply interrupting part 106 which can selectively interrupt the power supply of a portion corresponding to the function of the communication part, it is possible to stop the function of the communication part in a more complete form.

Here, although the display of the message that the communication part 104 becomes in operable may be performed using a letter message, the display may be performed by more instinctive methods including a method in which a mark "x" (meaning inoperable) is applied to a telephone icon on the display part 107.

With the use of the miniaturized piezoelectric vibrator manufactured by the manufacturing method of the present invention in the portable information equipment, the oscillation frequency and the resonance resistance value are hardly influenced by the external force. That is, the piezoelectric vibrator exhibits the sufficient electric characteristic against a tension or a compression force attributed to an ambient temperature change cycle applied to the vibrators after the piezoelectric vibrators are mounted on a board. Accordingly, the fluctuation of the electric characteristic is small even in the environmental atmosphere where the temperature difference is large and hence, it is possible to maintain the electronic equipments with high accuracy.

Embodiment 4

Figure 9:
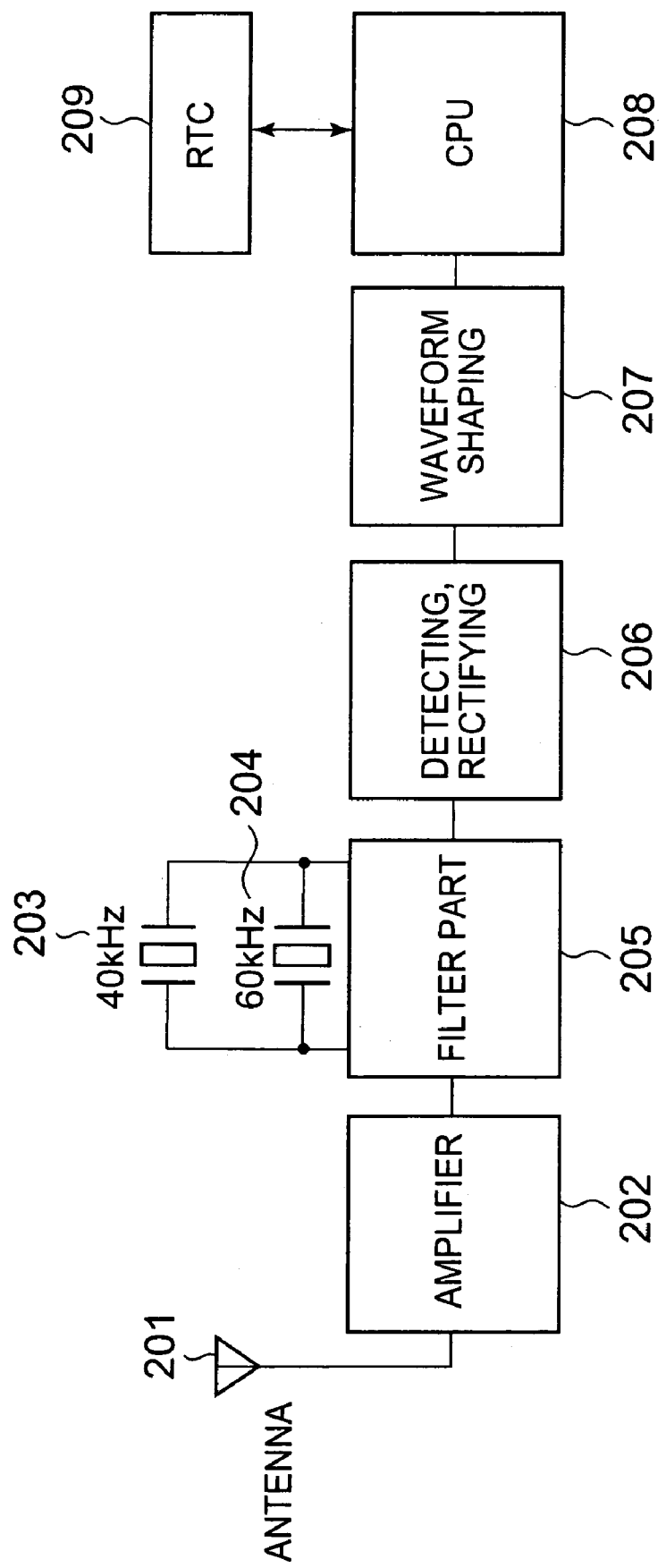
FIG. 9 is a schematic view showing a circuit block of an radio clock according to a fourth embodiment.

FIG. 9 is a schematic view showing a circuit block of a radio clock which constitutes an electronic equipment according to the fourth embodiment of the present invention. The embodiment shows a case in which the tuning-fork-type quartz crystal vibrator (piezoelectric vibrator) manufactured by the manufacturing method of the present invention is connected to a filter part of the radio clock.

The radio clock is a clock which has a function of receiving the standard electric wave containing time information and displaying the time information by automatically correcting the time to an accurate time. In Japan, transmission stations (transmitting facilities) which transmit the standard electric waves are located in Fukushima prefecture (40 KHz) and Saga prefecture (60 KHz) and these transmission stations transmit the standard electric waves respectively. Long waves having frequency of 40 KHz or 60 KHz have a property that the long waves are propagated on a surface of the earth and a property that the long waves are propagated while being reflected between fan ionosphere and the surface of the earth and hence, the propagation range is broad whereby the long waves cover the whole Japan with the above-mentioned two transmission stations.

In FIG. 9, an antenna 201 receives the standard electric waves formed of the long waves of 40 KHz or 60 KHz. The standard electric waves formed of long waves are electric waves obtained by applying the time information referred to as a time code to the carrier wave of 40 KHz or 60 KHz using the AM modulation.

The received standard electric waves formed of long waves are amplified by an amplifier 202. Subsequently, the standard electric waves are filtered by a filter part 205 containing quartz crystal vibrators 203, 204 having the same resonance frequency as the carrier wave frequency and are synchronized with the carrier wave. The filtered signal of given frequency is detected and demodulated by a detecting/rectifying circuit 206. Then, the time code is taken out through a waveform shaping circuit 207 and is counted by a CPU 208. The CPU 208 reads out the information such as the current year, the accumulated days, date, time and the like. The read-out information is reflected on a RTC 209 and the accurate time information is displayed.

Since the carrier wave is 40 KHz or 60 KHz, it is preferable to use the above-mentioned vibrator having the tuning-fork-type structure as the quartz crystal vibrators 203, 204 which constitute the filter parts respectively. Taking the long waves of 60 KHz, for example, as a size example of the tuning-fork-type vibrator piece, it is possible to configure the vibrator such that the vibrator has a total length of approximately 2.8 mm and a width size of a base portion thereof is approximately 0.5 mm.

The piezoelectric vibrator which is manufactured by the manufacturing method of the present invention is configured to be connected with the filter part of the radio clock and hence, the oscillation frequency and the resonance resistance value are hardly influenced by the external force. Accordingly, the piezoelectric vibrator exhibits the sufficient electric characteristic against a tension or a compression force attributed to an ambient temperature change cycle applied to the vibrators after the piezoelectric vibrators are mounted on a board. Accordingly, it is possible to allow the radio wave to be operated over a long period while maintaining the highly accurate filter function of the radio clock for a long period.

What is claimed is:

1. A method for manufacturing piezoelectric vibrators, comprising the steps of:
    integrally forming on a first wafer a plurality of vibrator pieces and frames so that the frames are connected to one end of and surround the respective vibrator pieces;
    forming first recessed portions on a bonding surface side of a second wafer;
    forming second recessed portions on a bonding surface side of a third wafer;
    forming a plurality of grooves having a V-shaped cross section in a non-bonding surface side of at least one of the second wafer and the third wafer at preselected positions;
    anodically bonding the first wafer, the second wafer and the third wafer in overlapping relation relative one another so that the first wafer is interposed between the bonding surface side of the second wafer and the bonding surface side of the third wafer; and
    cutting the overlapped first, second and third wafers at preselected positions to form the piezoelectric vibrators.

2. A method for manufacturing piezoelectric vibrators, comprising the steps of:
    integrally forming on a first wafer a plurality of vibrator pieces and frames so that the frames are connected to one end of and surround the respective vibrator pieces;
    forming first recessed portions on a bonding surface side of a second wafer;
    forming second recessed portions on a bonding surface side of a third wafer;
    forming a plurality of grooves having a V-shaped cross section in a non-bonding surface side of at least one of the second wafer and the third wafer at preselected positions;
    anodically bonding the first wafer, the second wafer and the third wafer in overlapping relation relative one another so that the first wafer is interposed between the bonding surface side of the second wafer and the bonding surface side of the third wafer; and
    cutting the overlapped first, second and third wafers along inclined surface portions of the V-shaped grooves to form the piezoelectric vibrators.

* * * * *